United States Patent [19]

Taguchi et al.

[11] Patent Number: 5,777,351
[45] Date of Patent: Jul. 7, 1998

[54] COMPRESSION BONDED TYPE SEMICONDUCTOR ELEMENT AND SEMICONDUCTOR DEVICE

[75] Inventors: Kazunori Taguchi; Yuzuru Konishi, both of Fukuoka, Japan

[73] Assignee: Mitsubishi Denki Kabushiki Kaisha, Tokyo, Japan

[21] Appl. No.: 777,007

[22] Filed: Jan. 7, 1997

Related U.S. Application Data

[63] Continuation of Ser. No. 580,086, Dec. 20, 1995, abandoned.

[30] Foreign Application Priority Data

May 31, 1995 [JP] Japan .................. 7-133919

[51] Int. Cl.⁶ .................................................. H01L 23/48
[52] U.S. Cl. .............................. 257/181; 257/182; 257/150; 257/688; 257/689; 257/718; 257/726; 257/730
[58] Field of Search .................... 257/181, 727, 257/147, 139, 688, 689, 150, 182, 718, 726, 730

[56] References Cited

U.S. PATENT DOCUMENTS

| | | | |
|---|---|---|---|
| 3,225,416 | 12/1965 | Diebold | 29/25.3 |
| 3,837,000 | 9/1974 | Platzoeder et al. | 257/689 |
| 3,931,635 | 1/1976 | Sundström | 257/689 |
| 5,345,096 | 9/1994 | Grüning | 257/182 |

FOREIGN PATENT DOCUMENTS

| | | | |
|---|---|---|---|
| 0320618 | 6/1989 | European Pat. Off. . | |
| 0516416 | 12/1992 | European Pat. Off. . | |
| 4227063 | 2/1994 | Germany . | |
| 60-055633 | 3/1985 | Japan | 257/688 |
| 60-55633 | 3/1985 | Japan . | |
| 63-047977 | 2/1988 | Japan | 257/151 |
| 63-04977 | 2/1988 | Japan . | |
| 3-201543 | 9/1991 | Japan . | |
| 5-93049 | 12/1993 | Japan . | |
| 6-188411 | 7/1994 | Japan . | |

Primary Examiner—Sara W. Crane
Assistant Examiner—David B. Hardy
Attorney, Agent, or Firm—Oblon, Spivak, McClelland, Maier, & Neustadt, P.C.

[57] ABSTRACT

A compression bonded type semiconductor element having a ring-shaped gate terminal in the form of an annular metal disk projecting through the side of an insulating cylinder. The ring-shaped gate terminal includes an inner circumferential planar portion which is disposed so as to be slidable on an annular ring gate electrode. The annular ring gate electrode is in contact with a gate electrode formed on a semiconductor substrate, and the ring gate electrode is pressed against the gate electrode via the ring-shaped gate terminal by an elastic body.

30 Claims, 6 Drawing Sheets

COMPRESSION BONDED TYPE SEMICONDUCTOR ELEMENT AND SEMICONDUCTOR DEVICE

This application is a continuation of application Ser. No. 08/580,086, filed on Dec. 20, 1995, now abandoned.

BACKGROUND OF THE INVENTION

1. Field of the Invention

The present invention relates to a compression bonded type semiconductor element such as a gate turn-off thyristor (GTO), and a manufacturing method for the same. The present invention also relates to a compression bonded type semiconductor device system which includes a compression bonded type semiconductor element and a gate drive device.

2. Description of the Related Art

Compression bonded type semiconductor elements and devices for large power use have realized advances in the capability to withstand high voltages and large capacities. Particularly for GTO elements, a 6000 A class maximum breaking current has been realized. As the breaking current increases, it becomes necessary to increase GTO segments connected in parallel. As a result, the diameter of a semiconductor substrate is increased, and package structure problems have arisen in providing a cathode, an anode and a leading-out portion of a gate electrode for providing uniform operation of a semiconductor substrate.

Particularly with increasing maximum breaking currents, a gate current flowing in the reverse direction (in turning off a GTO element) reaches a maximum of 1500 A to 2000 A. Thus, to accommodate contact defects resulting from repeated heat generation, compression bonded encapsulation using an elastic body for leading-out a gate electrode is employed for improving reliability.

Figure 9:
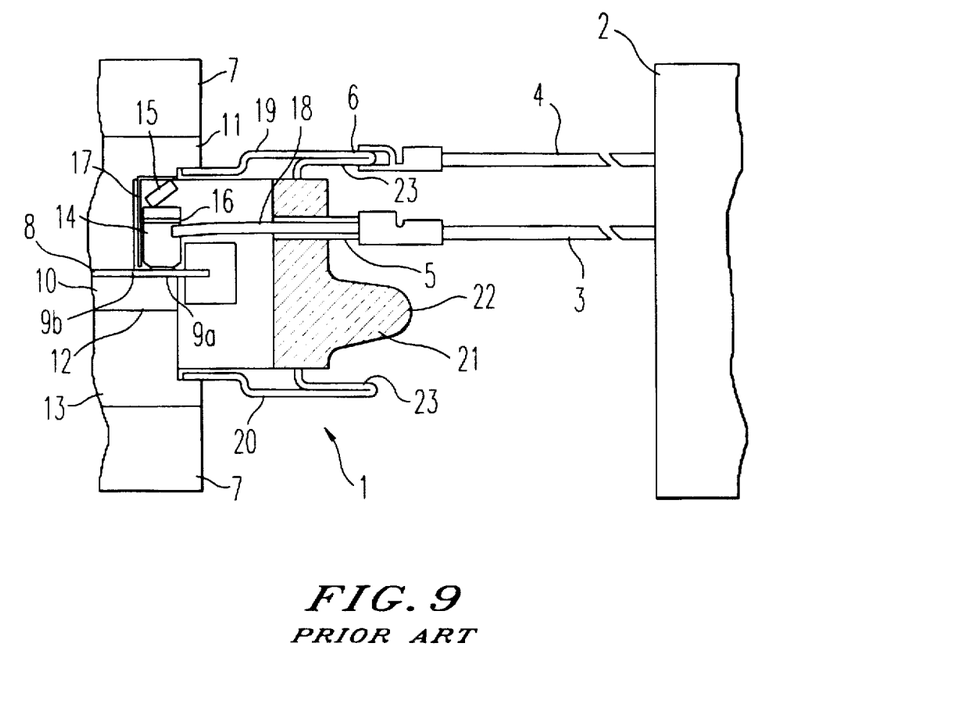
FIG. 9 is cross-sectional view of a conventional GTO.

FIG. 9 is a cross-sectional view of an example of a conventional GTO element including a control device as described in Japanese Utility Model Registration Application Laid-open No. 5-93049 (1993). In FIG. 9, reference numeral 1 designates a GTO element, while reference numeral 2 designates a gate drive device to control the GTO element 1. A gate external-lead 3 and a cathode external-lead 4 are formed of a shield wire or a twisted lead wire, and respectively connect a gate terminal 5 and a cathode terminal 6 of the GTO element 1 to the gate drive device 2 by soldering or fitting, while stack electrodes 7 press upon the GTO element 1. A semiconductor substrate 8 is provided with an Al (aluminum) gate electrode 9a formed at an outer circumferential portion of the front surface of the semiconductor substrate 8, and a cathode electrode 9b is formed inside the gate electrode 9a. A cathode distortion buffer disk 10 and a cathode post electrode 11 are respectively superposed on the front surface of the semiconductor substrate 8, on the side of the cathode electrode 9b. An anode distortion buffer disk 12 and an anode post electrode 13 are respectively superposed on the back surface of the semiconductor substrate 8 on the anode side (surface opposite to the cathode electrode). A ring gate electrode 14 is in contact with the gate electrode 9a of the semiconductor substrate 8. A Belleville spring 15 presses the ring gate electrode 14 against the gate electrode 9a via an annular insulator 16. In addition, an insulating sheet 17 is provided to insulate the ring gate electrode 14 from the cathode distortion buffer disk 10 and the cathode post electrode 11. A gate lead 18 is fixed to the ring gate electrode 14 at one end by brazing or welding, and is connected electrically to the gate terminal 5 at the other end. A first flange 19 is fixed to the cathode post electrode 11 and a second flange 20 is fixed to the anode post electrode 13. Further, an insulating cylinder 21 includes the gate terminal 5 and a projection 22, and end portions 23 of the insulating cylinder are hermetically fixed to the first and second flanges 19, 20, such that the GTO element 1 is hermetically sealed.

In the GTO element I as constructed above, the ring gate electrode 14 is annular, and the gate lead 18 extends from a position at which it is fixed to the annular ring gate electrode 14. As a result, with the implementation of a larger diameter semiconductor substrate 8, a gate current supplied to the semiconductor substrate 8 in turning on or off the GTO element 1 is concentrated locally, and permanent thermal distortion/destruction may result.

In the GTO element 1, the insulation distance between the gate terminal 5 and the anode post electrode 13, i.e. the length of the projection 22, could be increased, according to an operating voltage. However, as the size of the gate terminal 5 increases, the size of the GTO element 1 itself increases.

Figure 10:
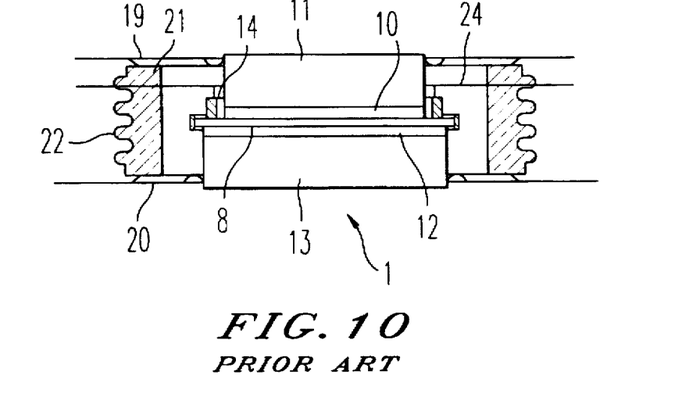
FIG. 10 is a cross-sectional view of another conventional GTO.

The structure of a GTO element disclosed in Japanese Patent Application Laid-open No. 6-188411 (1994), as shown in FIG. 10, can solve the above problem. In FIG. 10, like elements of FIG. 9 are denoted by common reference numerals. Reference numeral 24 denotes a ring-shaped gate conductor formed of a metal disk, which is biased by a spring to press against the ring gate electrode 14 at an end surface of a vertically bent inner circumferential portion thereof, and the outer circumferential portion of the metal disk gate conductor 24 is led outside through the side of the insulating cylinder 21.

As shown in FIG. 10, by leading the outer circumferential portion of the gate conductor 24 out through the side of the insulating cylinder 21, and applying a gate current to the gate conductor 24, the gate current can be supplied to the semiconductor substrate 8 in an isotropic manner. In addition, since the gate conductor 24 is formed as a metal disk, it is not necessary to increase the length of the insulating cylinder 21 in the vertical direction, such that the size of the GTO element 1 can be reduced.

However, a gate current required for turn-off is one-quarter to one-third of the breaking current. When a GTO element 1 having a large capacity is to be driven, it is necessary to improve the conducting capability of the gate lead 18. Accordingly, it is necessary, utilizing the GTO element 1 structured as shown in FIG. 9, to thicken the gate lead 18 to thereby reduce transmission losses. Thermal expansion of the thickened gate lead 18 causes a mechanical stress acting on the ring gate electrode 14 to increase, and this mechanical thermal stress cycle may cause the aluminum of the gate electrode 9a to wear locally. Furthermore, the ring gate electrode 14 imparts a mechanical stress to the insulating sheet 17, causing the insulating sheet 17 to wear or crack, and hence a short circuit between the ring gate electrode 14 and the cathode post electrode 11 occurs, with a resultant marked deterioration in reliability.

In addition, with the GTO element 1 shown in FIG. 10, although the problem of thickening the gate lead 18 (as in FIG. 9) can be solved, problems still remain with (1) of wear of the gate electrode resulting from thermal expansion of the gate conductor 24, and (2) a short circuit between the ring gate electrode 14 and the cathode post electrode 11 resulting from wearing or cracking in the insulating sheet 1.

Moreover, in the FIG. 9 arrangement, due to a connection loss in connecting the gate external-lead 3 to the gate terminal 5, and in connecting the cathode external-lead 4 to the cathode terminal 6 of the GTO element 1, a connection loss in connecting the gate external-lead 3 and the cathode external-lead 4 to the gate drive device 2, and also the inductance of these external lead wires (which accounts for 90% of a total inductance), the gate drive device 2 requires a large conducting capacity. As the GTO element 1 assumes a larger capacity, even if the size of the GTO element 1 can be reduced, the gate drive device 2 must be larger. This problem is also true with the GTO element shown in FIG. 10.

SUMMARY OF THE INVENTION

The present invention is intended to solve the problems described above. Accordingly, an object of the invention is to provide a compression bonded type semiconductor element and a method for manufacturing same which can prevent permanent thermal distortion/destruction caused by concentration of a gate current supplied to a semiconductor substrate, and which can prevent localized wear of a gate electrode caused by mechanical stress resulting from heat generation, and also prevent a short circuit between a ring gate electrode and a cathode post electrode caused by wear of or crack in an insulating sheet. It is also an object of the present invention to reduce the size of a compression bonded semiconductor device in a system in which the compression bonded type semiconductor element is combined with a gate drive device to thereby improve efficiency.

According to an aspect of the present invention, a compression bonded type semiconductor element is provided which includes a disk-shaped semiconductor substrate on the front surface of which a gate electrode is formed at an outer circumferential portion. A cathode electrode is formed inside the gate electrode. An anode electrode is formed on the back surface of the disk shaped semiconductor substrate. A cathode post electrode is disposed so as to be compression bondable to the cathode electrode via a cathode distortion buffer disk, and has a first flange. An anode post electrode is disposed so as to be compression bondable to the anode electrode via an anode distortion buffer disk, and has a second flange. An insulating cylinder contains the semiconductor substrate, the cathode distortion buffer disk, and the anode distortion buffer disk. End portions of the insulating cylinder are hermetically fixed to the first and second flanges.

An annular ring gate electrode contacts the gate electrode, and a ring-shaped gate terminal is formed as an annular disk projecting from or through the side of the insulating cylinder, with the ring-shaped gate terminal fixed hermetically to the insulating cylinder. An inner circumferential planar portion of the ring-shaped gate terminal is disposed so as to be slidable on the ring gate electrode. In addition, an elastic body presses the ring gate electrode against the gate electrode via the ring-shaped gate terminal, and an insulator electrically insulates the ring-shaped gate terminal and ring gate electrode from the cathode post electrode.

According to another aspect, the ring-shaped gate terminal has a bent portion inside the insulating cylinder. Further, the ring-shaped gate terminal can be provided with one or more through-holes therein, inside the insulating cylinder. In accordance with another aspect of the present invention, the ring-shaped gate terminal can include a bent portion outside of the insulating cylinder. According to a further aspect, the inner circumferential edge of the ring-shaped gate terminal is located outside of the inner circumferential edge of the ring gate electrode.

According to a still further aspect of the present invention, a point of application of the elastic body is located within the overlapping area of the ring-shaped gate terminal and the ring gate electrode in the compression bonded type semiconductor element. In addition, the ring-shaped gate terminal can be formed of different thicknesses, or of different materials, with respect to portions disposed inside and outside of the insulating cylinder.

In accordance with a still further aspect, a soft metal coating is utilized on the surface of the ring gate electrode of the compression bonded type semiconductor element. Further, the soft metal coating is provided on the surface of the ring gate electrode which slidably contacts the ring-shaped gate terminal, and is preferably a gold or silver plating.

According to a still further aspect of the present invention, a plurality of slits are cut in the ring-shaped gate terminal, at an inner circumferential portion, and extend in diametrical directions in the compression bonded type semiconductor element.

According to a still further aspect of the present invention, a compression bonded type semiconductor device is provided, which includes a compression bonded type semiconductor element having a disk-shaped semiconductor substrate, on the front surface of which a gate electrode is formed at an outer circumferential portion. A cathode electrode is formed radially inside of the gate electrode and, on the back surface of the substrate, an anode electrode is formed. A cathode post electrode is disposed so as to be compression bondable to the cathode electrode via a cathode distortion buffer disk, and has a first flange. An anode post electrode is disposed so as to be compression bondable to the anode electrode via an anode distortion buffer disk, and has a second flange. An insulating cylinder contains the semiconductor substrate, the cathode distortion buffer disk and the anode distortion buffer disk, and end portions of the insulating cylinder are hermetically fixed to the first and second flanges. An annular ring gate electrode contacts the gate electrode.

In addition, a ring-shaped gate terminal, formed as an annular disk, projects through the side of the insulating cylinder, and is hermetically fixed to the insulating cylinder, with an inner circumferential plane (or planar portion) disposed so as to be slidable on the ring gate electrode. An elastic body presses the ring gate electrode against the gate electrode via the ring-shaped gate terminal, and an insulator electrically insulates the ring-shaped gate terminal and ring gate electrode from the cathode post electrode. Stack electrodes compress the compression bonded type semiconductor element from the cathode post electrode side and from the anode post electrode side. Further, a disk-shaped control electrode is electrically connected to the cathode post electrode and is formed of an electrically conductive disk. A gate drive device is electrically connected to the ring-shaped gate terminal and the disk-shaped control electrode, and controls a gate current. According to a still further aspect, the disk-shaped control electrode is formed as an annular disk, and is arranged concentrically with the ring-shaped gate terminal in the compression bonded type semiconductor.

Further, the disk-shaped control electrode is preferably compression bonded to the cathode post electrode by the stack electrode in the compression bonded semiconductor device. According to yet another aspect, the disk-shaped control electrode and the ring-shaped gate terminal are connected via an insulating spacer. Further, the ring-shaped gate terminal and the gate drive device are electrically connected via a disk-shaped control gate electrode formed of an annular disk concentric with the ring-shaped gate terminal.

According to a still further aspect of the present invention, a manufacturing method is provided for a compression bonded type semiconductor element, which includes mounting of an insulator and an elastic body around a disk-shaped cathode post electrode having a first flange and a cathode distortion buffer disk located on the cathode post electrode. An insulating cylinder is mounted on the elastic body such that the inner circumferential portion of a ring-shaped gate terminal (formed as an annular disk) projects through the side of the insulating cylinder and is hermetically fixed to the insulating cylinder. The first flange and one end portion of the insulating cylinder are hermetically fixed together.

In addition, an annular ring gate electrode is disposed so as to contact the inner circumferential plane of the ring-shaped gate terminal, and a semiconductor substrate, an anode distortion buffer disk, and an anode post electrode having a second flange are superposed, in order, on the ring gate electrode and the cathode distortion buffer disk. The second flange and the other end portion of the insulating cylinder are then fixed together to form a fixed portion, and gas in the insulating cylinder is replaced with an inert gas.

According to a further aspect of the present invention, the gas in the insulating cylinder can be replaced with the inert gas through the fixed portion. According to a further preferred aspect, a bent portion can be formed on the ring-shaped gate terminal inside the insulating cylinder.

Additional objects, advantages and features of the invention will become apparent from the description which follows, particularly to those having ordinary skill in the art, upon examination of the following description as well as in practicing the present invention.

BRIEF DESCRIPTION OF THE DRAWINGS

A more complete appreciation of the invention and attendant advantages thereof will become readily apparent from the following detailed description, particularly when considered in conjunction with the drawings, in which.

DESCRIPTION OF THE PREFERRED EMBODIMENTS

Figure 1:
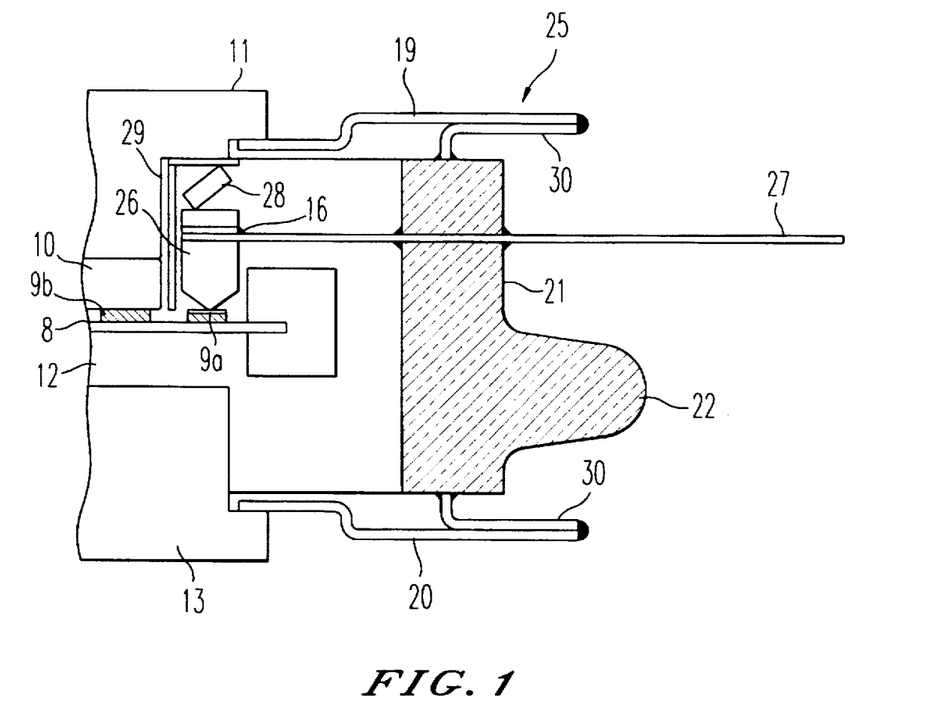
FIG. 1 illustrates a cross-sectional view of a compression bonded type semiconductor element according to an embodiment of the present invention.

FIG. 1 is a cross-sectional view of a compression bonded type semiconductor element according to an embodiment of the present invention. In FIG. 1, reference numeral 25 denotes the entirety of the compression bonded type semiconductor element, and reference numeral 8 denotes a semiconductor substrate on the front surface of which an Al (aluminum) gate electrode 9a is formed at an outer circumferential portion, while a cathode electrode 9b is formed inside the gate electrode 9a. A cathode distortion buffer disk 10 and a cathode post electrode 11 are, respectively, superposed on the front surface of the semiconductor substrate 8, on the side of the cathode electrode 9b. An anode distortion buffer disk 12 and an anode post electrode 13 are, respectively, superposed on the back surface of the semiconductor substrate 8 on the anode side (opposite surface to the cathode electrode). A ring gate electrode 26 is in contact with the gate electrode 9a of the semiconductor substrate 8, and a ring-shaped gate terminal 27, which is formed as an annular disk, has an inner circumferential plane or planar portion which is disposed so as to be slidable on the ring gate electrode 26.

An elastic body 28, e.g., a Belleville spring or a corrugated spring, presses the ring gate electrode 26, together with the ring-shaped gate terminal 27, against the gate electrode 9a via an annular insulator. An insulator 29, formed of an insulating sheet or the like, insulates the ring gate electrode 26 from the cathode distortion buffer disk 10 and the cathode post electrode 11. A first flange 19 is fixed to the cathode post electrode 11, and a second flange 20 is fixed to the anode post electrode 13.

An insulating cylinder 21, formed of ceramic or the like, is divided into upper and lower portions, and has a projection 22. The outer circumferential portion of the ring-shaped gate terminal 27 projects outside through the side of the insulating cylinder 21 and is hermetically fixed to the divided portion. End portions 30 of the insulating cylinder 21 are hermetically fixed to the first and second flanges 19 and 20. Thus, the compression bonded type semiconductor element 25 has a hermetically sealed structure, and the inside thereof is replaced/purged and filled with an inert gas.

A gate current is applied from the outer circumferential portion of the ring-shaped gate electrode 27 projecting from the side of the insulating cylinder 21, and the current is supplied to the semiconductor substrate 8 in an isotropic manner, whereby a permanent thermal distortion/destruction does not occur. In addition, since the surface of the inner circumferential portion of the ring-shaped gate terminal 27 is disposed to be slidable on the ring gate electrode 26, a mechanical stress which is imposed on the ring gate electrode 26, due to a thermal expansion of the ring-shaped gate terminal 27, can be lessened to thereby prevent the gate electrode 9a from wearing locally. The surface of the ring gate electrode 26 (on which the ring-shaped gate terminal 27 slides), is coated with soft metal, whereby the ring-shaped gate terminal 27 slides more smoothly on the ring gate electrode 26 to thereby provide a better result. Gold or silver plating is preferably used for the soft metal.

Figure 2A:
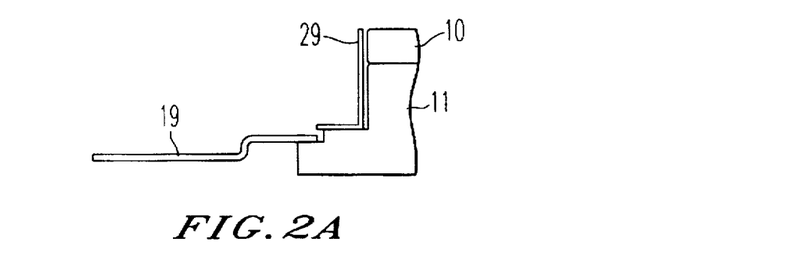
FIGS. 2(a)–(d) are cross-sectional views showing a manufacturing method for a compression bonded type semiconductor element according to an embodiment of the manufacturing method of the present invention.

FIGS. 2(a) to 2(d) depict manufacturing steps for a compression bonded type semiconductor element. As shown in FIG. 2(a), in the first step, the insulator 29, formed of an insulating sheet such as mica or polyimide resin, is mounted so as to insulate the side of the cathode post electrode 11 (to which the first flange 19 is fixed) and the side of the cathode distortion buffer disk 10 (which is superposed on the cathode post electrode 11).

Figure 2B:
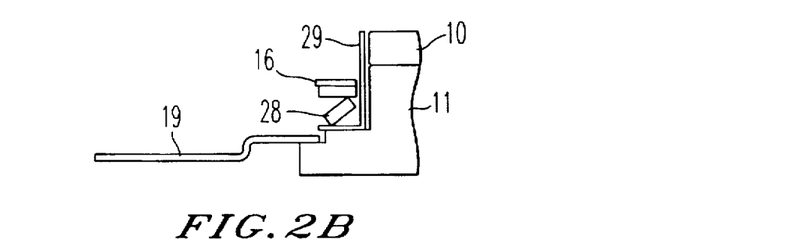

Next, as shown in FIG. 2(b), in the second step, the elastic body 28, e.g. an annular Belleville spring or corrugated spring, and the annular insulator 16, formed of mica or polyimide resin, are mounted in the order outside the insulator 29.

In parallel with the above first and second steps, the ring-shaped gate terminal 27 is hermetically fixed to the divided portion of the insulating cylinder 21 (which is divided into upper and lower portions), in such a manner that the ring-shaped gate terminal 27 projects from the side of the insulating cylinder 21.

Figure 2C:
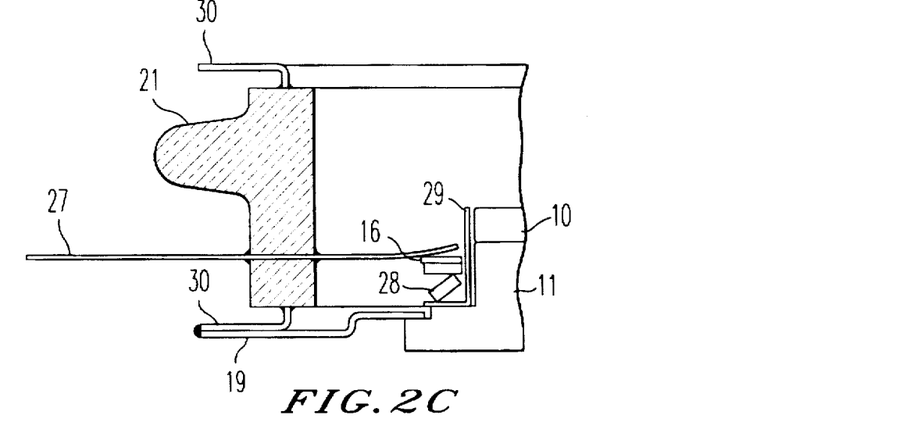

Next, as shown in FIG. 2(c), in the third step, the insulating cylinder 21 (to which the ring-shaped gate terminal 27 is fixed) is mounted such that the surface of the inner circumferential portion of the ring-shaped gate terminal 27 is slidable on the annular insulator 16, and the end portion 30 of the insulating cylinder 21 is hermetically fixed to the first flange 19 by brazing or the like.

Figure 2D:
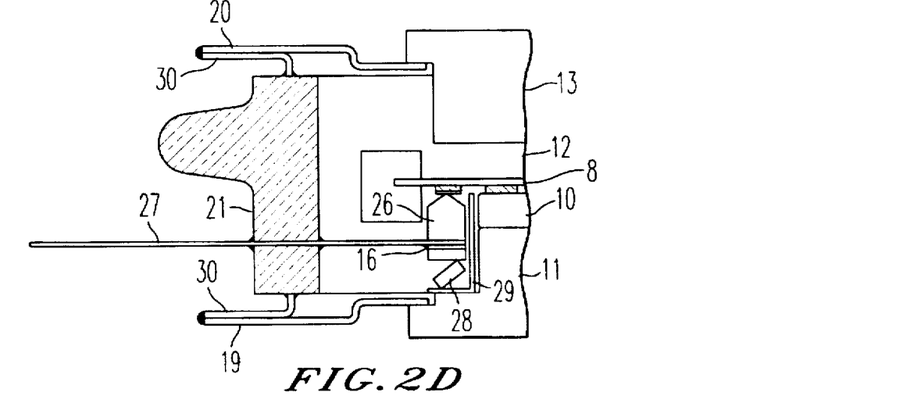

As shown in FIG. 2(d), in the fourth step, after the ring gate electrode 26 is mounted such that the surface of the inner circumferential portion of the ring-shaped gate terminal 27 is slidable thereon, the semiconductor substrate 8, the anode distortion buffer disk 12, and the anode post electrode 13 are superposed in order on the cathode distortion buffer disk 10. Finally, the second flange 20 is hermetically fixed to the end portion 30 of the insulating cylinder 21 while an inert gas is injected into the insulating cylinder 21 from an open portion to replace the inner air.

Figure 3:
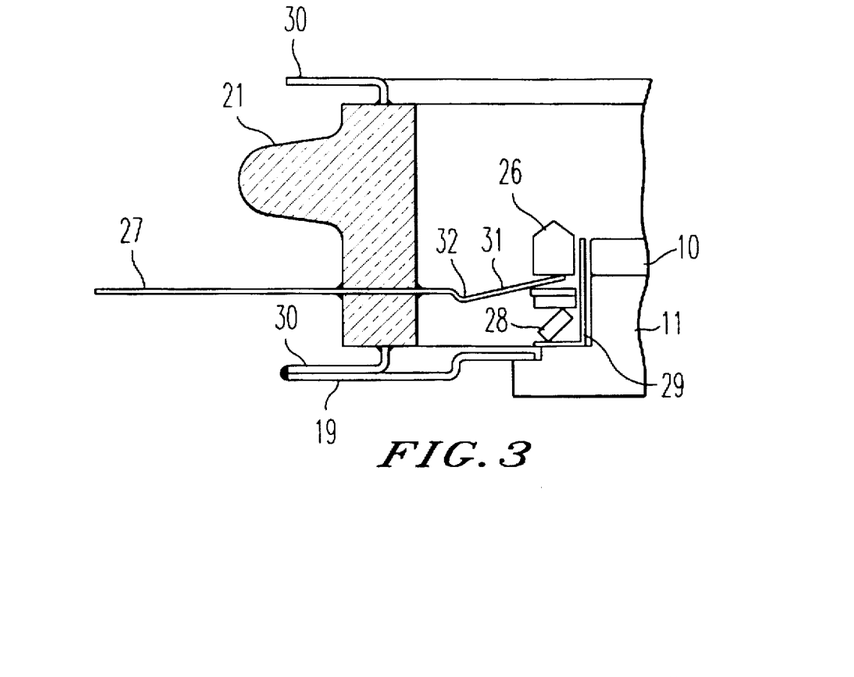
FIG. 3 illustrates a cross-sectional view of a compression bonded type semiconductor element according to another embodiment of the present invention.

According to the foregoing manufacturing method, replacement with an inert gas in the insulating cylinder 21 can be efficiently accomplished while the insulating cylinder 21 and the second flange 20 are being fixed together. In addition as shown in FIG. 3, a bent portion 32 is formed on the ring-shaped gate terminal 27 inside the insulating cylinder 21, to reduce a stress concentration which can occur in the ring-shaped gate terminal 27 at a portion fixed to the insulating cylinder 21 at the time of assembly and during actual operation, thereby preventing the ring-shaped gate terminal 27 from breaking at the fixed portion. In addition, one or more through holes 31 are formed in the ring-shaped gate terminal 27 inside the insulating cylinder 21, to more readily accomplish the replacement with an inert gas inside of the insulating cylinder 21.

Figure 4:
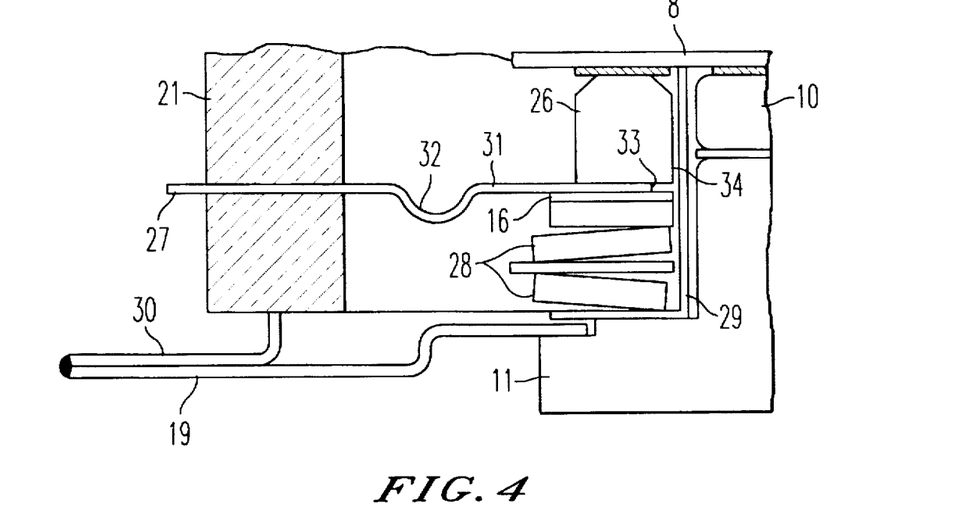
FIG. 4 shows a cross-sectional view of a compression bonded type semiconductor element according to a further embodiment of the present invention.

As shown in FIG. 4, an inner circumferential edge 33 of the ring-shaped gate terminal 27 is located radially outside of an inner circumferential edge 34 of the ring gate electrode 26, such that the ring-shaped gate terminal 27 does not contact the insulator 29, thereby preventing the insulator 29 from wearing.

Figure 5A:
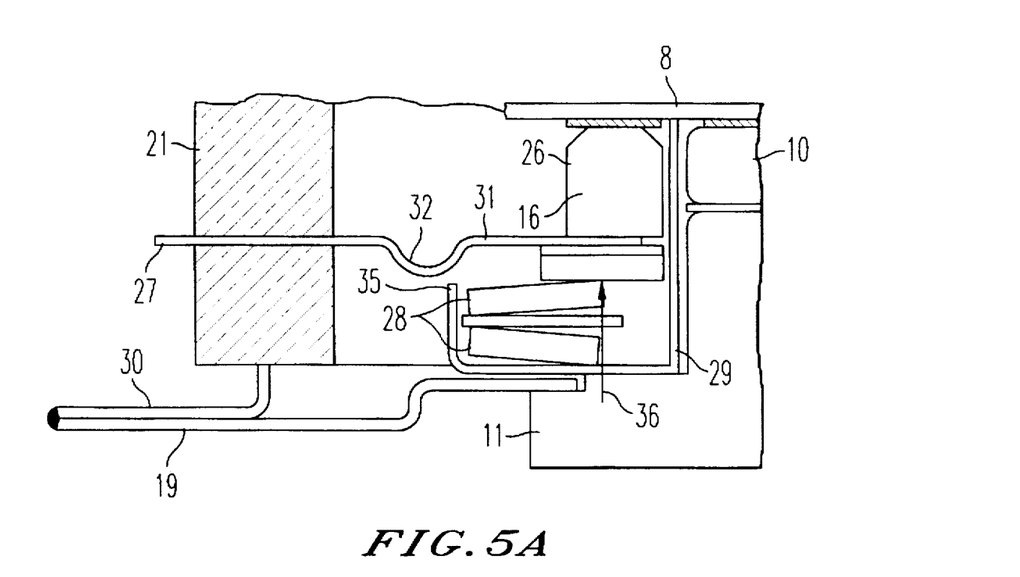
FIG. 5 illustrates a cross-sectional view of a compression bonded type semiconductor element according to still another embodiment of the present invention.
Figure 5B:
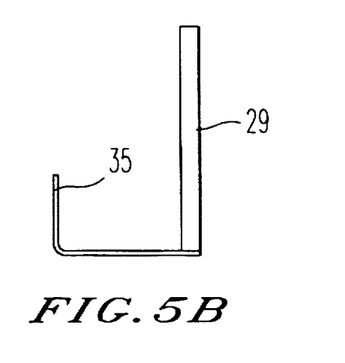
Figure 6:
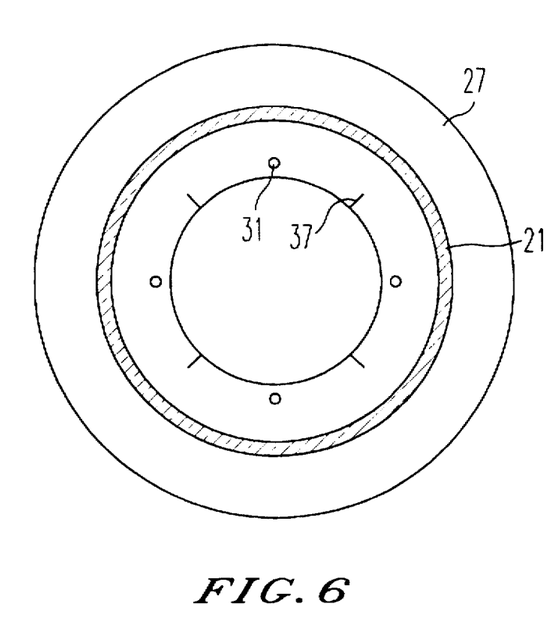
FIG. 6 is a horizontal cross-sectional view showing a compression bonded type semiconductor element according to a still further embodiment of the present invention.

In addition, as shown in FIG. 5, an L-shaped guide 35 can be provided with elastic bodies 28 mounted along the guide 35 such that a point of application 36 of the elastic bodies 28 falls in the overlapping area of the ring-shaped gate terminal 27 and the ring gate electrode 26, such that the ring-shaped gate terminal 27 and the ring gate electrode 26 are maintained in contact and slide smoothly with respect to each other. Further, as shown in a plan view of FIG. 6, slits 37 are cut in the ring-shaped gate terminal 27 all around the inner circumference thereof, whereby the ring-shaped gate terminal 27 can smoothly contact and slide on the ring gate electrode 26.

Figure 7:
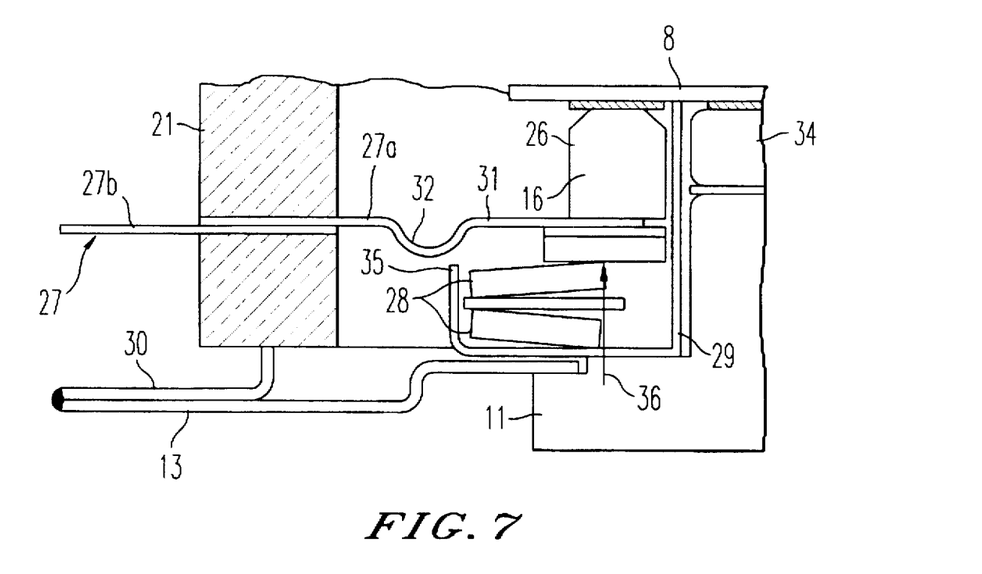
FIG. 7 is a cross-sectional view of a compression bonded type semiconductor element according to a still further embodiment of the present invention.

Further, as shown in FIG. 7, the ring-shaped gate terminal 27 is preferably different in material or thickness with respect to portions disposed inside and outside of the insulating cylinder 21. In particular, the ring-shaped gate terminal can be formed of an inner ring-shaped gate terminal 27a and an outer ring-shaped gate terminal 27b (of a different material or thickness than terminal 27a), whereby the ring-shaped gate terminal 27 can have an adequate elasticity inside the insulating cylinder 21 and an adequate rigidity outside the insulating cylinder 21.

Figure 8:
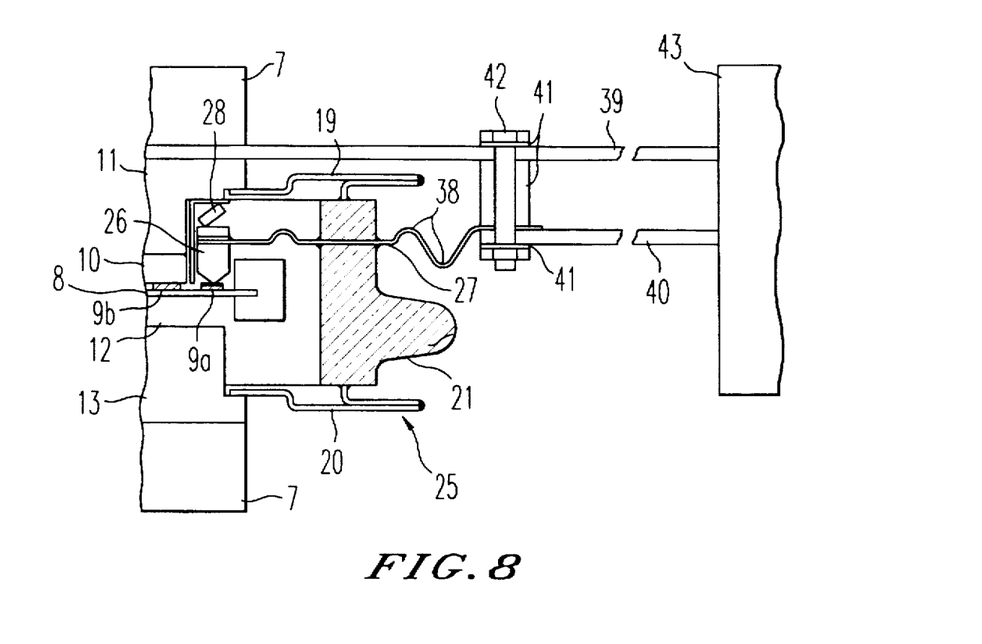
FIG. 8 illustrates a cross-sectional view of a compression bonded type semiconductor device according to an embodiment of the present invention.

FIG. 8 illustrates a compression bonded type semiconductor device as a system in which a compression bonded type semiconductor element is combined with a gate drive device. In FIG. 8, the same or equivalent features as in FIGS. 1 to 7 are denoted by common reference numerals. Reference numeral 38 denotes bent portions formed on the ring-shaped gate terminal 27 outside of the insulating cylinder 21. Stack electrodes 7 press the compression bonded type semiconductor element 25, and take current out. A disk-shaped control electrode 39 (formed as an annular metal disk), is disposed concentrically with the ring-shaped gate terminal 27, and is compression bonded to the cathode post electrode 11 by the stack electrode 7. A disk-shaped control gate electrode 40 is formed as an annular metal disk which is disposed concentrically with respect to the ring-shaped gate terminal 27, with the gate electrode 40 electrically connected to the ring shaped-gate terminal 27 at an inner circumferential portion thereof. An insulating sleeve 41 insulates the disk-shaped control electrode 39 from the ring-shaped gate terminal 27 together with the disk-shaped control gate electrode 40. Connecting parts 42, such as nuts and bolts, connect the disk-shaped control electrode 39 with the ring-shaped gate terminal 27 together with the disk-shaped control gate electrode 40 via the insulating sleeve 41. The disk-shaped control electrode 39 and the disk-shaped control gate electrode 40 are directly connected to a gate drive device 43.

The inductance of an external lead which electrically connects the compression bonded type semiconductor device 25 and the gate drive device 43 will now be considered. Inductance L of a twin wire is expressed by the following formula (1).

$$L = 0.4 \left( \mu_r \ln \frac{B + \sqrt{B^2 - d^2}}{d} + \mu_1 \delta \right) [\mu H/m] \quad (1)$$

where $\mu_r$: Relative magnetic permeability of medium

B: Center distance between conductors [mm]

d : Diameter of conductor [mm]

$\mu_1$: Relative magnetic permeability of conductor $$\delta: 2.81 \times 10^{-3} \frac{d}{2} \sqrt{\mu_1 f \sigma}$$

$\sigma$: Conductivity [S/m]

f: Frequency [MHz]

As seen from formula (1), the inductance L can be reduced by reducing the center distance between conductors, B, or by increasing the conductor diameter, d.

According to the structure described above, the disk-shaped control electrode 39 and the disk-shaped control gate electrode 40, both having a larger outer diameter, are disposed concentrically with the annular ring-shaped gate terminal 27, and the disk-shaped control electrode 39 and the disk-shaped control gate electrode 40 are directly connected to the gate drive device 43. As a result, the inductance of the external lead can be reduced to a great extent, and thus the gate drive device 43 can be reduced in conducting capacity and thus in size.

In addition, the bent portions 38 are formed on the ring-shaped gate terminal 27, to thereby reduce stress concentrations which can occur in the ring-shaped gate terminal 27 at a portion fixed to the insulating cylinder 21 when making a connection with the disk-shaped control electrode 39 and the disk-shaped control gate electrode 40, or from a heat cycle during actual operation.

Further, with the disk-shaped control electrode 39 connected with the ring-shaped gate terminal 27 and the disk-shaped control gate electrode 40 via the insulating sleeve 41 using connecting parts 42, the distance between the disk-shaped control electrode 39 and the ring-shaped gate terminal 27 and the disk-shaped control gate electrode 40 is fixed, and thus the inductance of the external lead is quite less likely to vary, thereby providing stable operation of the gate drive device 43.

Moreover, the disk-shaped control electrode 39 is annular, such that the inductance thereof as an external lead can be reduced, and also a switching speed of the compression bonded type semiconductor element 25 can be increased. Further, the disk-shaped control electrode 39 is compression bonded to the cathode post electrode 11 by the stack electrode 7 to thereby facilitate assembly. In addition, the disk-shaped control electrode 39 and the disk-shaped control gate electrode 40 are directly connected to the gate drive device 43, so that a loss of connection becomes quite small, and also a switching speed of the compression bonded type semiconductor element 31 can be further increased.

Obviously, many alternatives, modifications, and variations will be apparent to those skilled in the art in light of the above teachings. It is therefore to be understood that the present invention may be practiced otherwise than as specifically described herein.

What is claimed as new and is desired to be secured by Letters Patent of the United States is:

1. A compression bond type semiconductor element comprising:

a disk-shaped semiconductor substrate having a front surface on which a electrode is disposed at an outer circumferential portion, and wherein a cathode electrode is disposed inside the gate electrode on said font surface, said disk-shaped semiconductor substrate including a back surface on which an anode electrode is disposed;

a cathode post electrode disposed to be compression bondable to the cathode electrode via a cathode distortion buffer disk, said cathode post electrode having a first flange;

an anode post electrode disposed to be compression bondable to the anode electrode via an anode distortion buffer disk, said anode post electrode having a second flange;

an insulating cylinder which contains said semiconductor substrate, the cathode distortion buffer disk, and the anode distortion buffer disk, said insulating cylinder including end portions which are hermetically fixed to the first and second flanges;

an annular ring gate electrode which contacts the gate explode;

a ring-shaped gate terminal which is formed as an annular disks said ring-shaped gate terminal projecting through a side of said insulating cylinder and being hermetically fixed to said insulating cylinder such that said ring-shaped gate terminal includes a first annular portion disposed radially outside of said insulating cylinder and a second annular portion disposed radially inside of said insulating cylinder, wherein said second annular portion of said ring-shaped gate terminal includes an inner circumferential portion which is slidably disposed on said ring gate electrode such that said inner circumferential portion is slidable relative to said ring gate electrode;

an elastic body which is separate from said ring-shaped gate term and which provides a pressing force for pressing said ring gate electrode against the gate electrode, and wherein said elastic body further provides a pressing force for pressing said ring-shaped gate terminal against said ring gate electrode; and an insulator which electrically insulates said ring-shaped gate terminal and said ring gate electrode from said cathode post electrode.

2. A compression bonded type semiconductor element as recited in claim 1, wherein said ring-shaped gate terminal includes a bent portion disposed inside of said insulating cylinder.

3. A compression bonded type semiconductor element as recited in claim 1, wherein said ring-shaped gate terminal includes at least one through hole therein, with said at least one through hole disposed inside of said insulating cylinder.

4. A compression bonded type semiconductor element as recited in claim 1, wherein said ring-shaped gate terminal includes a bent portion disposed outside of said insulating cylinder.

5. A compression bonded type semiconductor element as recited in claim 1, wherein an inner circumferential edge of said ring-shaped gate terminal is disposed radially outside of an inner circumferential edge of said ring gate electrode.

6. A compression bonded type semiconductor element as recited in claim 1, wherein a point of application of said elastic body is located within an overlapping area of said ring-shaped gate terminal and said ring gate electrode.

7. A compression bonded type semiconductor element as recited in claim 1, wherein said ring-shaped gate terminal includes a first portion disposed inside of said insulating cylinder and a second portion disposed outside of said insulating cylinder, and wherein said first portion includes at least one of: (a) a different thickness than said second portion, and (b) a different material than said second portion.

8. A compression bonded type semiconductor element as recited in claim 1, wherein said inner circumferential portion of said ring gate electrode which slidably contacts said ring-shaped gate terminal is coated with a soft metal.

9. A compression bonded type semiconductor element as recited in claim 8, wherein the soft metal comprises one of a gold plating and a silver plating.

10. A compression bonded type semiconductor element as recited in claim 1, wherein a plurality of slits are cut in said ring-shaped gate terminal at the inner circumferential portion, said slits extending diametrical directions.

11. A compression bonded type semiconductor element as recited in claim 1, wherein said inner circumferential portion of said ring-shaped gate terminal which is slidably disposed on said ring gate electrode includes a substantially flat inner annular portion of said ring-shaped gate terminal.

12. A compression bonded type semiconductor element as recited in claim 11, wherein said ring-shaped gate terminal includes a bent portion disposed at a location between said insulating cylinder and said inner circumferential portion.

13. A compression bonded type semiconductor element as recited in claim 12, wherein said ring-shaped gate terminal is substantially flat at a first location adjacent said bent portion and radially inside of said bent portion, and wherein said ring-shaped gate terminal is substantially flat at a second location adjacent said bent portion and radially outside of said bent portion.

14. A compression bonded semiconductor element as recited in claim 13, wherein said ring-shaped gate terminal includes at least one through hole therein at a location between said insulating cylinder and said inner circumferential portion.

15. A compression bonded semiconductor element as recited in claim 1, wherein said ring-shaped gate terminal includes at least one through hole therein at a location between said insulating cylinder and said inner circumferential portion.

16. A compression bonded semiconductor element as recited in claim 1, wherein said ring-shaped gate terminal includes a bent portion at a location between said insulating cylinder and said inner circumferential portion, and wherein said ring-shaped gate terminal is substantially flat at a first location adjacent said bent portion and radially inside of said bent portion, and further wherein said ring-shaped gate terminal is substantially flat at a second location adjacent said bent portion and radially outside of said bent portion.

17. A compression bonded type semiconductor element as recited in claim 1, wherein said insulator includes a tubular portion disposed radially between said ring-shaped gate terminal and said cathode post electrode.

18. A compression bonded type semiconductor device, comprising:
  (a) a compression bonded type semiconductor element comprising:
    (i) a disk-shaped semiconductor sate having a front surface on which a gate electrode is disposed at an outer circumferential portion, and wherein a cathode electrode is disposed inside the gate electrode on said front surface, said disk-shaped semiconductor substrate including a back surface on which an anode electrode is disposed,
    (ii) a cathode post electrode which is disposed so as to be compression bondable to the cathode electrode via a cathode distortion buffer disk, said cathode post electrode having a first flange,
    (iii) an anode post electrode disposed to be compression bondable to the anode electrode via an anode distortion buffer disk, said anode electrode post having a second flange,
    (iv) an insulting cylinder which coins the semiconductor substrate, the cathode distortion buffer disk, and the anode distortion buffer disk, said insulating cylinder including end portions which are hereby fixed to the first and second flanges,
    (v) an annular ring gate electrode which contacts the gate electrode,
    (vi) a ring-shaped gate terminal which is formed as an annular disk projecting through a side of the insulating cylinder and which is hermetically fixed to the insulating cylinder such that said ring-shaped gate terminal includes a first annular portion disposed radially outside of said insulating cylinder and a second annular portion disposed radially inside of said insulating cylinder, wherein said second annular portion of said ring-shaped gate terminal includes an inner circumferential portion which is slidably disposed on the ring gate electrode such that said inner circumferential portion is slidable relative to said ring gate electrode,
    (vii) an elastic body which is separate from said ring-shaped gate terminal and which provides a pressing force for pressing the ring gate electrode against the gate electrode, and wherein said elastic body further provides a pressing force for pressing the ring-shaped gate terminal against said ring gate electrode, and
    (viii) an insulator which electrically insulates the ring-shaped gate terminal and ring gate electrode from the cathode post electrode;
  (b) stack electrodes which compress said compression bonded type semiconductor element from a cathode post electrode side and from an anode post electrode side;
  (c) a disk-shaped control electrode electrically connected to the cathode post electrode, said disk-shaped control electrode formed as an electrically conductive disk; and
  (d) a gate drive device which is electrically connected to the ring-shaped gate terminal and to said disk-shaped control electrode, and wherein said gate drive device controls a gate current.

19. A compression bonded type semiconductor device as recited in claim 18, wherein said disk-shaped control electrode is formed as an annular disk and is concentrically disposed with the ring-shaped gate terminal.

20. A compression bonded type semiconductor device as recited in claim 18, wherein said disk-shaped control electrode is compression bonded to the cathode post electrode by said stack electrode.

21. A compression bonded type semiconductor device as recited in claim 18, wherein said disk-shaped control electrode and the ring-shaped gate terminal are connected via an insulating spacer.

22. A compression bonded type semiconductor device as recited in claim 18, wherein the ring-shaped gate terminal and said gate drive device are connected electrically via a disk-shaped control gate electrode formed as an annular disk concentric with the ring-shaped gate terminal.

23. A compression bonded type semiconductor device as recited in claim 18, wherein said inner circumferential portion of said ring-shaped gate terminal which is slidably disposed on said ring gate electrode includes a substantially flat inner annular portion of said ring-shaped gate terminal.

24. A compression bonded type semiconductor device as recited in claim 23, wherein said ring-shaped gate terminal includes a bent portion disposed at a location between said insulating cylinder and said inner circumferential portion.

25. A compression bonded type semiconductor device as recited in claim 24, wherein said ring-shaped gate terminal is substantially flat at a first location adjacent said bent portion and radially inside of said bent portion, and wherein said ring-shaped gate terminal is substantially flat at a second location adjacent said bent portion and radially outside of said bent portion.

26. A compression bonded semiconductor device as recited in claim 25, wherein said ring-shaped gate terminal includes at least one through hole therein at a location between said insulating cylinder and said inner circumferential portion.

27. A compression bonded semiconductor device as recited in claim 18, wherein said ring-shaped gate terminal includes at least one through hole therein at a location between said insulating cylinder and said inner circumferential portion.

28. A compression bonded semiconductor device as recited in claim 18, wherein said ring-shaped gate terminal includes a bent portion at a location between said insulating cylinder and said inner circumferential portion, and wherein said ring-shaped gate terminal is substantially flat at a first location adjacent said bent portion and radially inside of said bent portion, and further wherein said ring-shaped gate terminal is substantially flat at a second location adjacent said bent portion and radially outside of said bent portion.

29. A compression bonded type semiconductor device as recited in claim 18, wherein said insulator includes a tubular portion disposed radially between said ring-shaped gate terminal and said cathode post electrode.

30. A compression bonded semiconductor device as recited in claim 18, wherein an inner circumferential edge of said ring-shaped gate terminal is disposed radially outside of an inner circumferential edge of said ring gate electrode.

* * * * *